US012581607B2

(12) United States Patent
Söderberg et al.

(10) Patent No.: US 12,581,607 B2
(45) Date of Patent: Mar. 17, 2026

(54) ELECTRONIC POWER CONVERTER

(71) Applicant: SMA Solar Technology AG, Niestetal
(DE)

(72) Inventors: Torsten Söderberg, Söhrewald (DE);
Alexander Benn, Dornstätten (DE)

(73) Assignee: SMA Solar Technology AG, Niestetal
(DE)

( * ) Notice: Subject to any disclaimer, the term of this
patent is extended or adjusted under 35
U.S.C. 154(b) by 483 days.

(21) Appl. No.: 18/097,570

(22) Filed: Jan. 17, 2023

(65) Prior Publication Data

US 2023/0164943 A1      May 25, 2023

Related U.S. Application Data

(63) Continuation of application No.
PCT/EP2021/070025, filed on Jul. 16, 2021.

(30) Foreign Application Priority Data

Jul. 17, 2020     (DE) ..................... 10 2020 119 040.9

(51) Int. Cl.
*H05K 5/30* (2025.01)
*H02M 7/00* (2006.01)
*H05K 7/14* (2006.01)

(52) U.S. Cl.
CPC .............. *H05K 5/30* (2025.01); *H02M 7/003*
(2013.01); *H05K 7/14324* (2022.08); *H05K
7/14325* (2022.08)

(58) Field of Classification Search
CPC .. H05K 5/30; H05K 7/14324; H05K 7/14325;
H02M 7/003
See application file for complete search history.

(56) References Cited

U.S. PATENT DOCUMENTS

| | | | |
|---|---|---|---|
| 7,379,305 B2 * | 5/2008 | Briggs ................. | H05K 7/1424 |
| | | | 361/727 |
| 7,768,799 B2 * | 8/2010 | Cramer ................. | H02M 7/003 |
| | | | 361/823 |
| 10,720,775 B2 | 7/2020 | Berger et al. | |
| 2001/0046144 A1 * | 11/2001 | Murabayashi ..... | H05K 7/14324 |
| | | | 363/69 |
| 2004/0166714 A1 * | 8/2004 | Huang ............... | H01R 13/6273 |
| | | | 439/330 |

(Continued)

FOREIGN PATENT DOCUMENTS

| | | |
|---|---|---|
| DE | 69600716 T2 | 4/1999 |
| DE | 102009054439 A1 | 6/2011 |

(Continued)

OTHER PUBLICATIONS

Machine Translation for DE102012220280A1 (Year: 2025).*

(Continued)

*Primary Examiner* — Allen L Parker
*Assistant Examiner* — Peter Krim
(74) *Attorney, Agent, or Firm* — Eschweiler & Potashnik,
LLC

(57) ABSTRACT

A modular electronic power converter is disclosed and
includes a first housing, a second housing, and a coupling
element. The coupling element is arranged between the
housings and is connected to at least one of the housings via
a detent connection.

21 Claims, 10 Drawing Sheets

(56) References Cited

U.S. PATENT DOCUMENTS

| | | | |
|---|---|---|---|
| 2005/0097706 A1* | 5/2005 | Vackar ................ | G06F 1/1601 16/330 |
| 2007/0115616 A1* | 5/2007 | Vackar ................... | H05K 5/30 361/601 |
| 2008/0180909 A1 | 7/2008 | Illerhaus et al. | |
| 2011/0294336 A1* | 12/2011 | Stockinger .......... | H05K 7/1432 439/377 |
| 2013/0240233 A1 | 9/2013 | Kwon | |
| 2014/0009896 A1 | 1/2014 | Nikola et al. | |
| 2018/0184542 A1 | 6/2018 | Aitzetmueller et al. | |
| 2019/0210839 A1* | 7/2019 | Buetler ................ | E04B 1/4107 |
| 2021/0226434 A1* | 7/2021 | Mruczek ............... | H02G 5/007 |

FOREIGN PATENT DOCUMENTS

| | | | | |
|---|---|---|---|---|
| DE | 102012220280 | A1 * | 5/2014 | ........ H05K 7/20927 |
| DE | 102014105985 | A1 | 10/2015 | |
| EP | 1160952 | A2 | 12/2001 | |
| EP | 1953908 | A2 | 8/2008 | |
| JP | H0928079 | A * | 1/1997 | |
| WO | 2008028205 | A1 | 3/2008 | |
| WO | 2010091445 | A1 | 8/2010 | |

OTHER PUBLICATIONS

Machine Translation for JPH09028079A (Year: 2025).*
International Search Report dated Mar. 29, 2022 in connection with PCT/EP2021/070025.

* cited by examiner

ELECTRONIC POWER CONVERTER

CROSS REFERENCE TO RELATED APPLICATIONS

This application is a continuation of International Patent Application Number PCT/EP2021/070025, filed on Jul. 16, 2021, which claims priority to German Patent Application number 10 2020 119 040.9, filed on Jul. 17, 2020, and is hereby incorporated by reference in its entirety.

FIELD

The disclosure relates to an electronic power converter having a housing.

BACKGROUND

A power converter is an electrical power handling device that exchanges electrical power with other electrical units through its connections and manipulates it by electronic means. For example, power converters include inverters, DC voltage converters, frequency converters, battery converters, power supplies for AC or DC loads, and the like.

DE 10 2014 105 985 discloses an inverter which has a plurality of converter modules, wherein each converter module has its own housing. The converter modules can comprise various functions, for example, converting electrical power, e.g. converting direct current to direct current or direct current to alternating current or vice versa. The converter modules can be electrically connected via plug connectors and thus combined in different ways, wherein such a combination always results in an electronic power converter.

WO2016/012541 describes accommodating an inverter, as used, for example, in photovoltaic systems for converting direct current into alternating current, in a housing which can be fixed to a wall by means of a wall bracket.

The size of the housing of a power converter is basically dependent on the rated power of the power converter. With a rated power in the range of about one kilowatt to one megawatt, a common power converter regularly exchanges currents of several dozen amperes at voltages of a few hundred volts. The connections of the power converters are dimensioned accordingly. In addition, there are regularly high requirements for electromagnetic compatibility and protection class of a power converter. By contrast, a low weight and a low volume of the power converter or at least of the converter modules of a power converter are desirable, especially to allow assembly and, where necessary, repair.

SUMMARY

The disclosure addresses the problem of further simplifying the assembly of a power converter at a place of use.

In one embodiment, an electronic power converter is of modular design and has a first housing, a second housing and a coupling element arranged between the housings. The coupling element is connectable to at least one of the housings via a detent connection. Such a power converter can be, for example, a power electronic inverter for a photovoltaic system. Due to the modular structure of the housing of the power converter, it is possible to easily provide different configurations of the power converter. This allows the power converter to be easily and efficiently matched to the intended use, e.g., the type and application of the photovoltaic system with which the power converter is to interact. Different components of the power converter can be accommodated here in different configurations in different housings and can easily be suitably assembled and mounted due to the modular structure. Due to the provided coupling element, which can be latched to at least one housing, the versatility of the structure can be further increased and the assembly can be further simplified. In particular, coupling elements can be provided in various embodiments, e.g. sealing and/or with passages for, for example, cables and the like.

In one embodiment of the power converter, the housings each have a rear side and a peripheral frame. The frame of the first and/or the second housing has at least one slot on a first frame side and/or a second frame side. In one embodiment, the slot runs transversely to the long edge of the frame side, for example, transversely to the perimeter of the frame. The slot is configured to latch with the coupling element to allow a secure detent connection. In embodiments, the first and/or the second frame side comprises one or more further slots to allow an even more secure latching with the coupling element. In yet a further embodiment, both the first and second frame sides comprise the slot or slots. This may provide further expandability of the power converter. In one embodiment, it is advantageous if the first and second frame sides face each other. In one embodiment, the first and/or the second frame side have, in addition to the slot or slots, further through-recesses through which connections, e.g. in the form of electrical cables, can run between the two housings.

In one embodiment, the coupling element is plate-like and has a base plate with at least one through-recess, wherein the coupling element is arranged in a planar manner between the first and the second housing. In one embodiment, the coupling element is elongate and has, for example, comparable proportions to the cross-section of the first and/or the second housing. Due to the plate-like design of the coupling element, a secure, planar coupling of the first and second housings can be achieved. The through-recess is suitable for accommodating connection elements, for example, electrical connections, in order to connect components of the power converter accommodated in the first housing to components of the power converter accommodated in the second housing. In one embodiment, the coupling element has a plurality of, in particular two, through-recesses.

In one embodiment, the base plate has at least one first detent projection running transversely, for example, perpendicularly, to the base plate and having a first detent lug. In one embodiment, the detent projection extends parallel to the surface normal of the detent projection and runs transversely, for example, perpendicularly, to the longitudinal direction of the base plate. The detent projection is intended to be inserted into one of the slots of the housing and is elongate in one embodiment. The detent projection can then be latched in the slot of the first or the second housing via the detent lug. In one embodiment, the detent lug points towards the edge of the base plate of the coupling element. In further embodiments, the coupling element may have further detent projections with further detent lugs.

In one embodiment, the coupling element has a second detent projection with a second detent lug on the side of the base plate opposite the first detent projection, for example, perpendicular to the base plate. In one embodiment, the second detent projection with the second detent lug is symmetrical to the first detent projection and first detent lug. In such a case, the base surface of the base plate is substantially the plane of symmetry of the first and second detent projections.

In a further embodiment, the frame of the first housing and the frame of the second housing each comprise at least one slot. The slots of the housings are arranged such that the housings can be arranged relative to the coupling element such that the first detent projection of the coupling element can be latched into the slot of the first housing, and such that the second detent projection of the coupling element can be latched into the slot of the second housing. Thus, the first and second housings are connected to each other by the coupling element, in that the coupling element is arranged between the frames of the housings.

In one embodiment, the base plate of the coupling element is made of solid material, for example, plastic. This allows further stabilization of the power converter.

In one embodiment, the at least one through-recess of the coupling element has a peripheral protrusion, which is arranged centrally in the through-recess. Via the peripheral protrusion it is possible, for example, to lock inlays or inserts in the through-recess. In one embodiment, the coupling element has an elastic insert that has a peripheral groove. The insert can be arranged in the through-recess of the coupling element in such a way that the peripheral protrusion engages in the groove so that the insert seals the through-recess, in particular against moisture, air and/or dust.

For example, the elastic insert has at least one recess, which is formed as a blind recess or through-recess. The through-recess is configured to serve as a feedthrough for current-carrying lines of the power converter. This makes it possible to form the power converter in a modular manner and to establish electrical connections between the components accommodated in the housings, in particular by the frames of the housings also having through-holes at positions which correlate with the through-recesses of the coupling element or the insert in the assembled state.

In one embodiment, the power converter comprises a wall bracket. The first housing and/or the second housing each have a peg on opposite third and fourth frame sides oriented substantially perpendicular to the first frame side and/or the second frame side. The wall bracket has a substantially U-shaped profile with a base side attachable to a wall and two edge sides, wherein the edge sides each have a T-shaped recess. In the assembled state, the edge sides of the wall bracket rest against the opposite third and fourth frame sides of the first or the second housing in such a way that the pegs each engage in a respective one of the T-shaped recesses. In one embodiment, the foot of the T-shape serves here to guide the peg at the beginning of the assembly process, while the end points of the roof of the T-shape serve as a receptacle in the assembled state.

In one embodiment, the T-shaped recesses of the wall bracket with the roof of the T-shape run substantially parallel to the base side and parallel to the third and fourth frame sides. This allows the roof of the T-shape to serve as a receptacle for a peg in the assembled state. In one embodiment, the pegs have a circular cross-section for this purpose.

In one embodiment, the first housing and/or the second housing has two elongate rear projections running parallel to each other in their longitudinal direction and parallel to the third and fourth frame sides, wherein the pegs arranged on the sides of the rear projections facing each other. This allows the pegs to be received in the T-shapes on an inner side, so that the appearance need not be impaired when viewed from outside the housings.

In one embodiment, the edge sides of the wall bracket are formed as a V-profile with a first leg and a second leg, wherein the first leg of each edge side adjoins the base side and the second leg of each edge side adjoins the first leg. The vertices of the V-shape are each directed outwards. In the assembled state, the rear projections lie flat on the outer sides of the respective second legs of the wall bracket. In one embodiment, the inner surfaces of the rear projections are inclined correspondingly to the second leg of the wall bracket so that, in the assembled state, the rear projections can lie flat against the second legs. In one embodiment, the rear projections lie on the outside of the wall bracket.

In one embodiment, the T-shaped recesses of the wall bracket are opposite each other and are centered in the respective second legs of the edge side. The foot points of the T-shaped recesses are closed or open. Even when the foot points of the T-shaped recesses are closed, the pegs of the housing can engage the foot of the T-shaped recess because the second leg of the wall bracket is inclined inwardly. The pegs are, in one embodiment, located on the inside of the rear projections. The distance between the pegs is thus greater than the distance between the front edges of the second legs and insertion is possible even when the foot of the T-shape is closed.

To increase stability, at least one of the housings can be additionally fixed to the wall bracket, for example, by means of a screw that can be screwed to an upper end of the second leg of the wall bracket.

In one embodiment, the first housing is connected to a first wall bracket and the second housing is connected to a second wall bracket, wherein, in an assembled state of the power converter, the pegs of the first housing are arranged at respective lower end points of the roof of the T-shaped recesses of the first wall bracket and the pegs of the second housing are arranged at respective upper end points of the roof of the T-shaped recesses of the second wall bracket. This embodiment allows a particularly simple assembly, in which first the first housing is mounted on the first wall bracket and then the second housing is mounted on the second wall bracket by guiding the pegs of the second housing in the T-shaped recess of the second wall bracket in such a way that the second housing can be pushed from below in the direction of the first housing and against the coupling element arranged below the first housing. The second housing is then at least temporarily held by the first housing by the latching of the coupling element, in particular until it is otherwise fixedly connected to the first housing, for example, via a separate screw connection, and/or until the second housing itself is fastened to the wall bracket or the wall.

In one embodiment, the coupling element may comprise a display unit configured to display operational data of the power converter.

BRIEF DESCRIPTION OF THE FIGURES

In the following, the disclosure is further explained and described with reference to exemplary embodiments shown in the figures.

DETAILED DESCRIPTION

Figure 1:
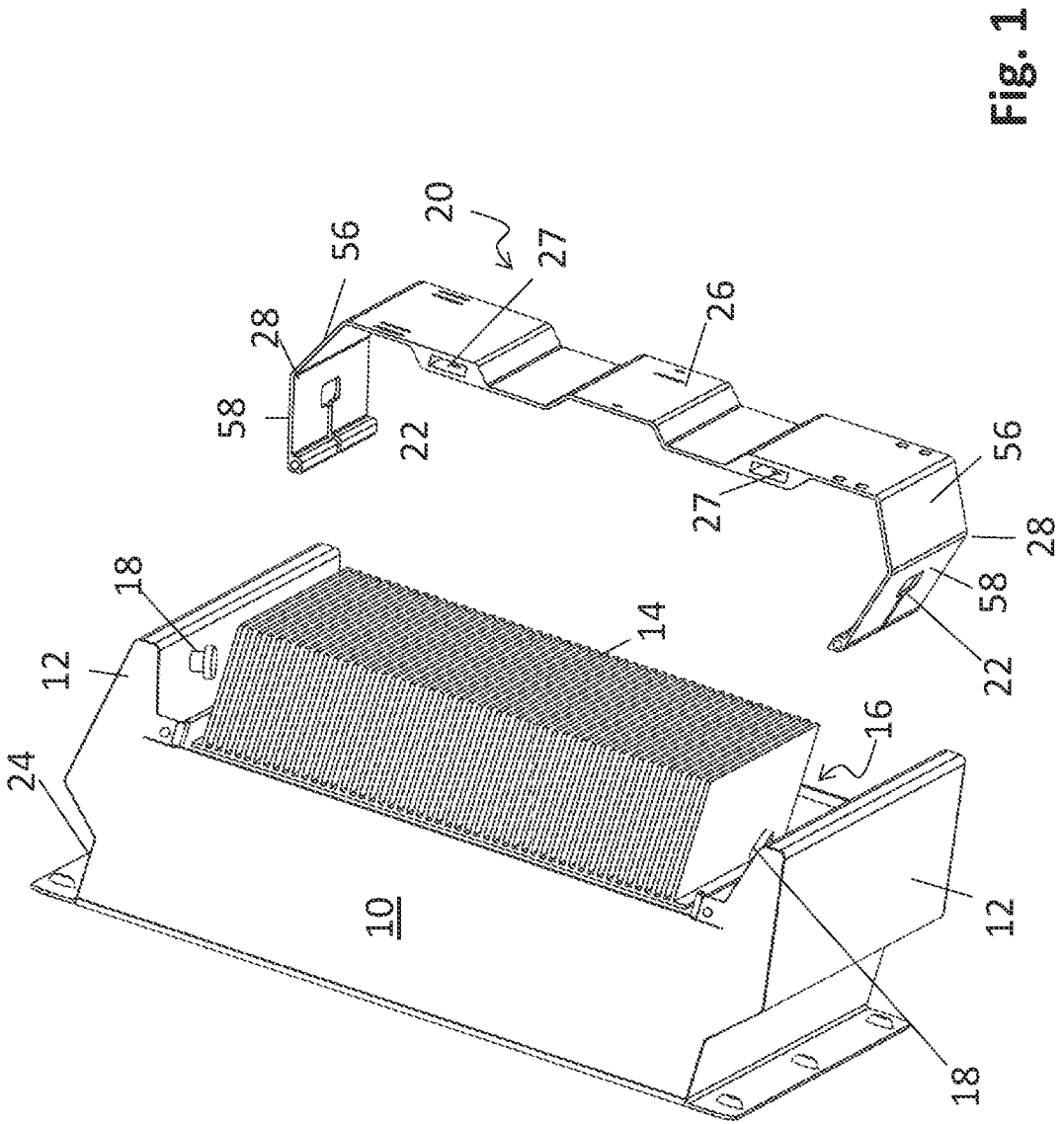
FIG. 1 schematically shows a power converter with a first housing and a wall bracket, FIG. 2 schematically shows a wall bracket from the side, FIG. 3 schematically shows a power converter with the first housing and the attached wall bracket, FIG. 4 schematically shows a plan view of two wall brackets, FIG. 5 schematically shows a power converter with two wall brackets as well as the first and a second housing, FIG. 6 schematically shows two coupling elements, FIG. 7 schematically shows a longitudinal section through each of the two coupling elements, FIG. 8 schematically shows a longitudinal section through the first and second housings and through the two coupling elements, FIG. 9 schematically shows the first housing and one of the coupling elements, FIG. 10 schematically shows the first housing, the coupling element and the second housing.

FIG. 1 shows schematically from an oblique bottom view a power converter with a first housing 10. The first housing 10 has a rear side 16 and a peripheral frame 24. Cooling fins 14 are arranged on the rear side 16 of the housing 10. To the side of the cooling fins 14, there are located on the rear side 16 two rear projections 12, each of which has a peg 18 on its inner side. The two rear projections 12 frame the cooling fins 14 from two opposite sides. The pegs 18 of the two rear projections 12 are opposite each other.

FIG. 1 further schematically illustrates a wall bracket 20. The wall bracket 20 has a substantially U-shaped profile with a base side 26 and two edge sides 28. The base side 26 has two guides 27 for receiving one wall rail 62 each (cf. FIG. 4). The edge sides 28 in turn have a V-profile with a first leg 56 and a second leg 58. The V-profile of the two edge sides 28 is directed outwardly here, wherein the first leg 56 is inclined outwardly and the second leg 58 is inclined inwardly. The wall bracket 20 is configured to be attached to a wall or the like by its base side 26.

Figure 5:
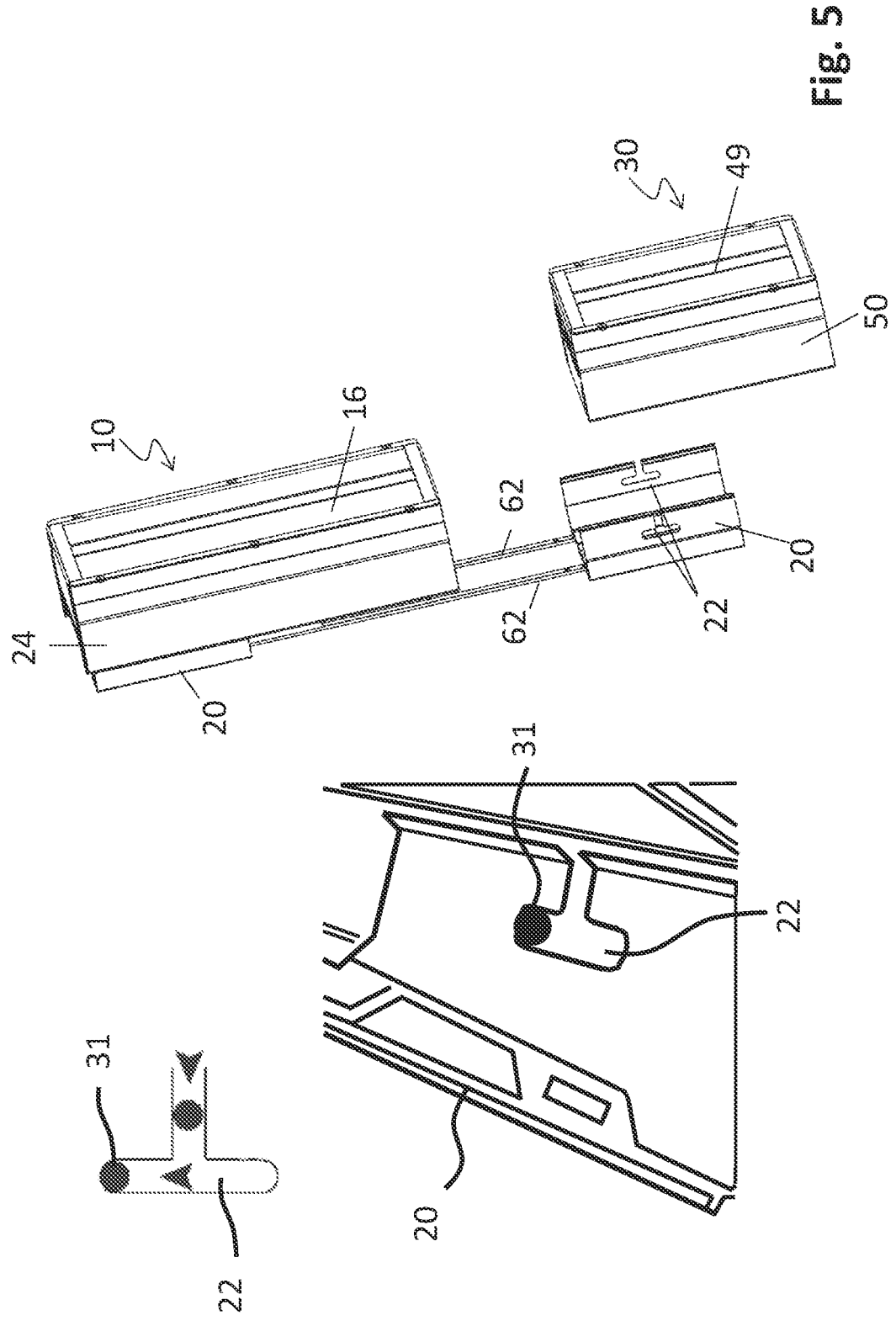

A T-shaped recess 22 is formed centrally in each of the second legs 58 of the two edge sides 28, the T-shaped recesses being formed as retaining grooves for holding the first housing 10 or the second housing 30 (cf. FIG. 5). The T-shaped recess 22 comprises a foot and a roof resembling a T-shape, wherein the roof is arranged perpendicular to the foot (see e.g. FIG. 5). The T-shaped recess 22 is arranged such that the roof of the T-shape 22 is arranged parallel to the edge of the second leg 58 and hence parallel to the base side 26. The foot of the T-shaped recess 22 runs perpendicularly towards the edge of the second leg 58. The foot of the T-shaped recess 22 can be closed at its footpoint or open at the edge of the second leg 58.

Figure 2:
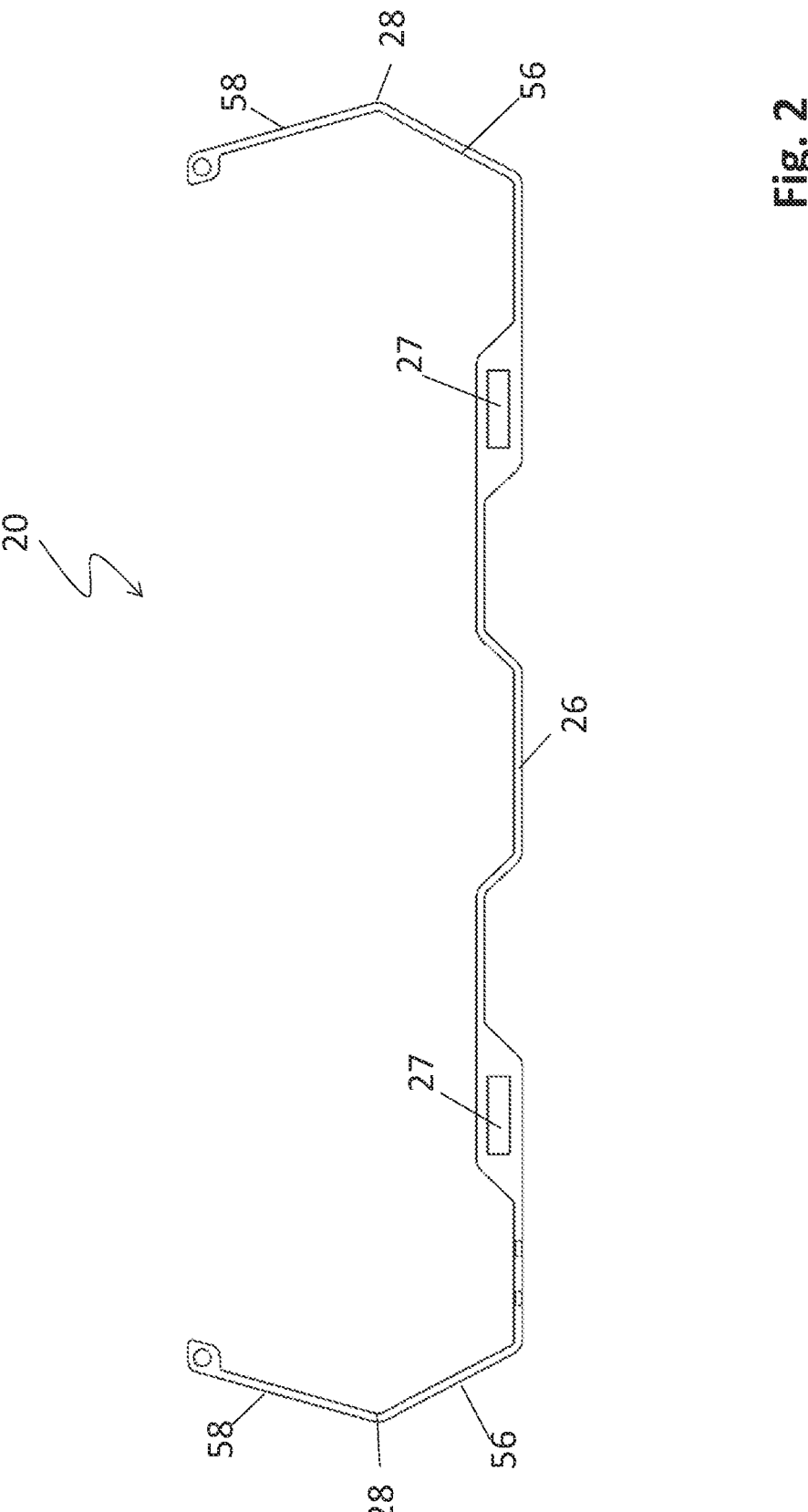

FIG. 2 shows a schematic view from the side of the wall bracket 20. The base side 26 has two guides 27 for receiving wall rails 62 (cf. FIG. 4). The edge sides 28 have a V-profile, wherein the first leg 56 of the V-profile is inclined outwardly and the second leg 58 of the V-profile is inclined inwardly.

Figure 3:
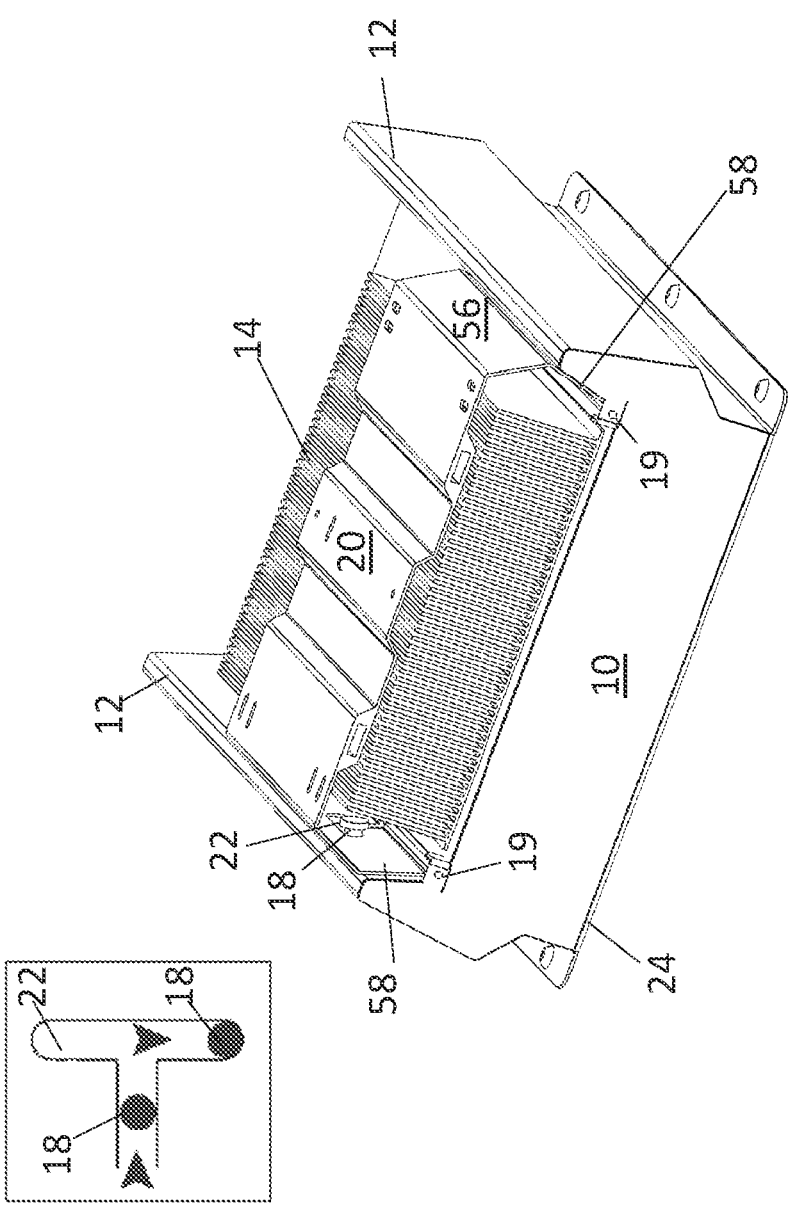

FIG. 3 schematically shows a power converter with the first housing 10 and the wall bracket 20. The wall bracket 20 is plugged onto the housing 10 so that the pegs 18 engage in the T-shaped recess 22. In this case, the pegs 18 are located at one end of the roof of the T-shaped recess 22. When plugged on, the peg 18 is inserted at the foot end into the T-shaped recess 22, is guided over the foot of the T-shaped recess 22 to the roof of the T-shaped recess 22, and from there to one end of the roof of the T-shaped recess 22. By means of one or more screws 19, the housing 10 can be fixed to the wall bracket 20, for example, to an upper end of the second leg 58.

Figure 4:
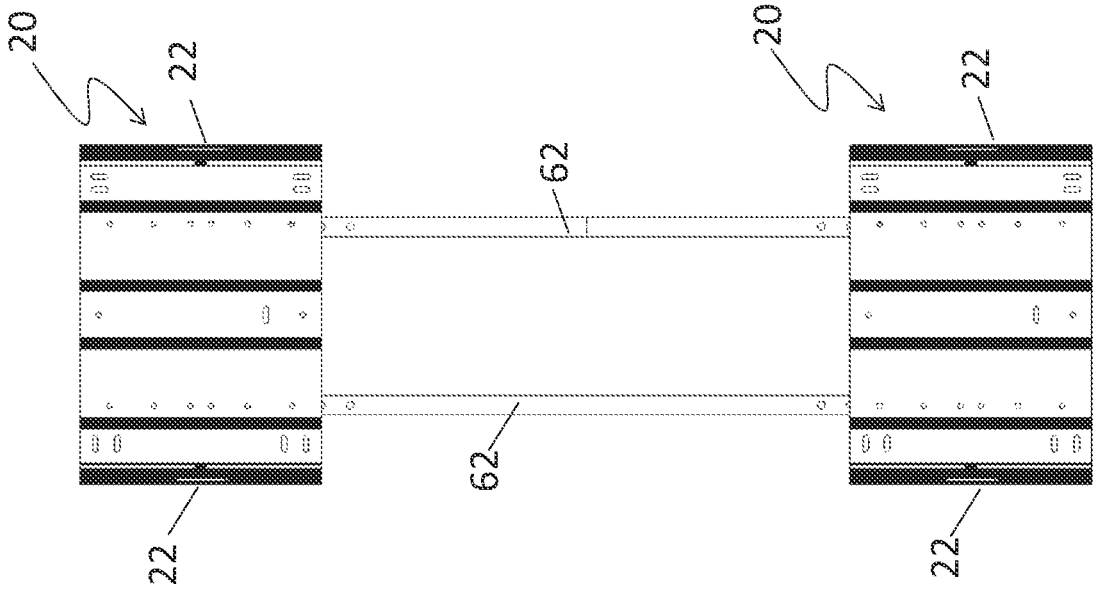

FIG. 4 schematically shows a front view of two wall brackets 20 attached to a wall or the like. Each of the wall brackets 20 has two wall rails 62 received in its guides 27. The wall rails 62 allow for easy mounting of the wall brackets 20 with the correct spacing. Also shown are the T-shaped recesses 22, into the foot of which the pegs 18 or the pegs 31 (cf. FIG. 5) can be inserted for mounting.

FIG. 5 schematically shows a power converter with two wall brackets 20 as well as the first housing 10 and a second housing 30. The second housing 30 has a rear side 49 and a peripheral frame 50. In the right part of the figure, the first housing has already been fitted onto the upper wall bracket 20 and, where necessary, fixed in place.

The left side of FIG. 5 shows how the second housing 30 can be fitted onto the lower wall bracket 20. The second housing 30 has rear projections in the same manner as the first housing, the inner sides of the rear projections having the pegs 31. First, a peg 31 of the second housing 30 is inserted into the foot of the T-shaped recess 22. After the peg reaches the roof of the T-shaped recess 22, the second housing 30 is pushed upwards so that the pegs are guided to the upper end of the roof of the T-shaped recess 22. By latching using a coupling element 32 or 64 (cf. FIG. 6), the second housing 30 can then be locked to and held against the first housing 10 via the coupling device or element 32, 64.

Figure 6:
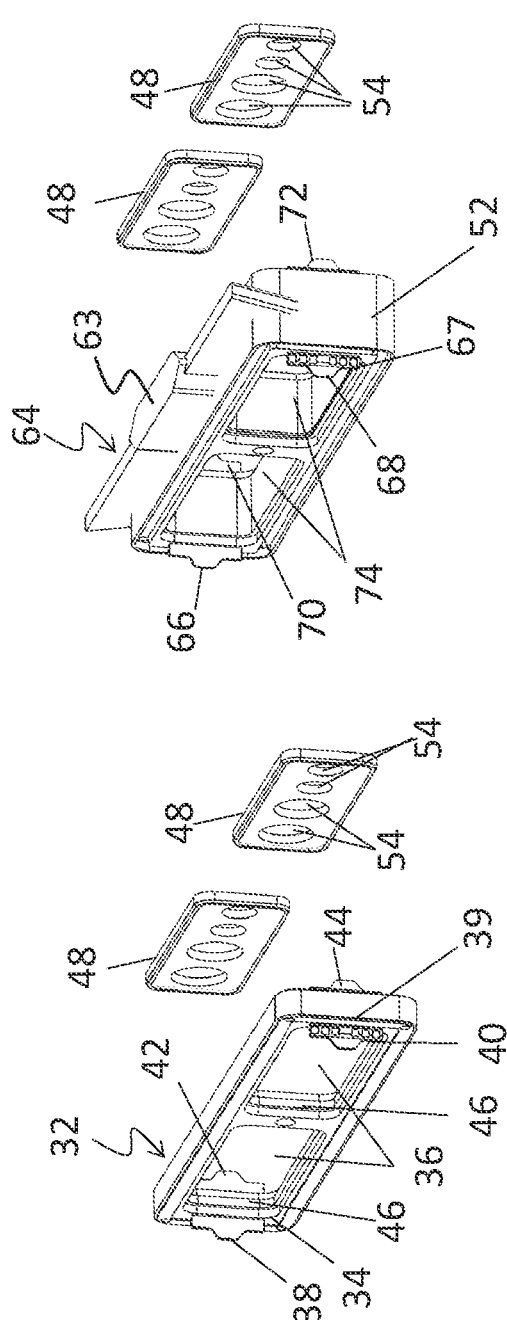

FIG. 6 schematically shows two coupling devices or elements 32, 64. Both have a plate-like elongate basic form.

Figure 7:
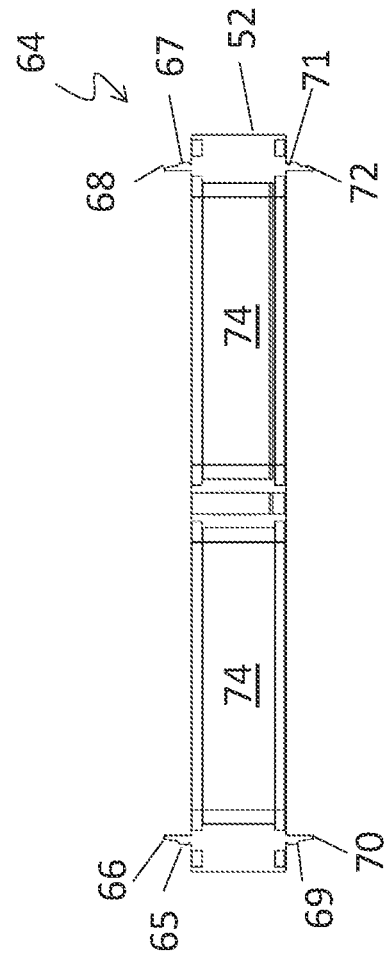
Figure 7:
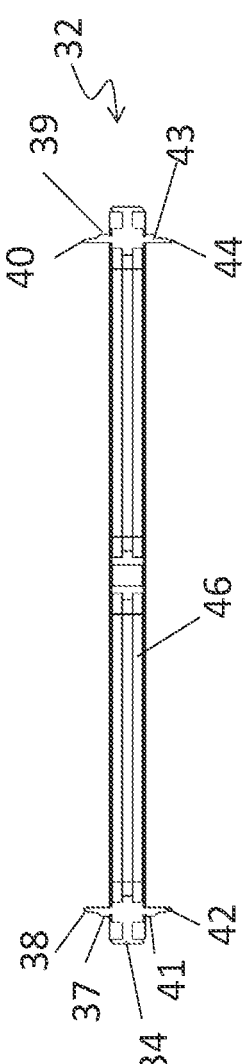

The first coupling element 32 has a base plate 34 with two through-recesses 36. Each of the through-recesses 36 has an inner peripheral protrusion 46 that is centered in the through-recess 36. The first coupling element 32 has four detent protrusions 38, 40, 42, 44. As shown in FIG. 7, the detent protrusion or projection 38 has a detent lug 37, the detent projection 40 has a detent lug 39, the detent projection 42 has a detent lug 41, and the detent projection 44 has a detent lug 43. The detent projections 38 and 42 are opposite each other on opposite sides of the base plate 34 and point away from each other, wherein their detent lugs 37 and 41 point in parallel in the same direction. The detent projections 40 and 44 lie opposite each other on opposite sides of the base plate 34 and point away from each other, wherein their detent lugs 39 and 43 point in parallel in the same direction.

The second coupling element 64 has a base plate 52 with two through-recesses 74 and optionally a display element 63. The display element 63, which can have a touch-sensitive surface, can be used, for example, to display status information or operational data of the power converter and to implement a user interface for user interaction with the power converter. The second coupling element 64 includes four detent protrusions 66, 68, 70, 72. The detent projections 66, 68, 70, 72 each have a detent lug 65, 67, 69, 71, shown in FIG. 7. The detent projections 66 and 70 are located opposite each other on opposite sides of the base plate 52 and point away from each other. Their detent lugs 65 and 69 point in parallel in the same direction. The detent projections 68 and 72 lie opposite each other on opposite sides of the base plate 52 and point away from each other. Their detent lugs 67 and 69 point in parallel in the same direction.

The coupling element has inserts 48 for closing the through-recesses 36, 74. The inserts 48 are plate-like and have through-recesses 54. The inserts 48 are, for example, made of rigid elastic material such as solid plastic and can be inserted into the through-recesses 36, 74 of the coupling elements 32 and 64. Electrical lines, for example, can then run through the through-recesses 54 of the inserts 48 to interconnect components of the power converter located in different housings 10, 30. The inserts 48 seal the through-recesses 36, 74 and thus the entire power converter (hermetically) from the particular environment and, by their through-recesses 54, provide a suitable guide for the electrical lines.

Furthermore, elastic inserts can be provided for the through-recesses 36, 74 of the coupling elements 32, 64. The elastic inserts can seal the relevant housing, to which they can be attached, from the environment and, for example, have a groove in which the protrusion 46 can engage. Sealing elastic inserts have, for example, no recesses or blind recesses. The sealing is performed, for example, against moisture, air and/or dust. The elastic inserts can, for example, be formed as a gel pad. The elastic inserts can also optionally have through-recesses through which electrical lines can be routed, in particular such powers which (in sum) can transport electrical powers of the order of magnitude of the rated power of the power converter. For both types of insert, elastic or rigid, it is advantageous if coupling elements 32, 64, which are arranged between housings, have through-recesses 54. Coupling elements 32, 64 that are connected to only one housing 10, 30, for example, are provided with inserts without through-recesses so that they can seal the housing 10, 30.

FIG. 7 schematically shows longitudinal sections through the coupling elements 32 and 64.

The coupling element 64 has the two through-recesses 74. In coupling element 64, the detent projections 66 and 70 are arranged opposite each other and point in opposite directions. The detent projections 68 and 72 are arranged opposite each other and point in opposite directions. The detent projections 66 and 68 point in the same direction and are arranged on the same side of the base plate 52. The detent projections 70 and 72 point in the same direction and are arranged on the same side of the base plate 52.

The coupling element 32 has the two through-recesses 36 with the protrusion 46 peripherally therein. In coupling element 32, detent projections 38 and 42 are arranged opposite each other and point in opposite directions. The detent projections 40 and 44 are arranged opposite each other and point in opposite directions. The detent projections 38 and 40 point in the same direction and are arranged on the same side of the base plate 34. The detent projections 42 and 44 point in the same direction and are arranged on the same side of the base plate 34.

Figure 8:
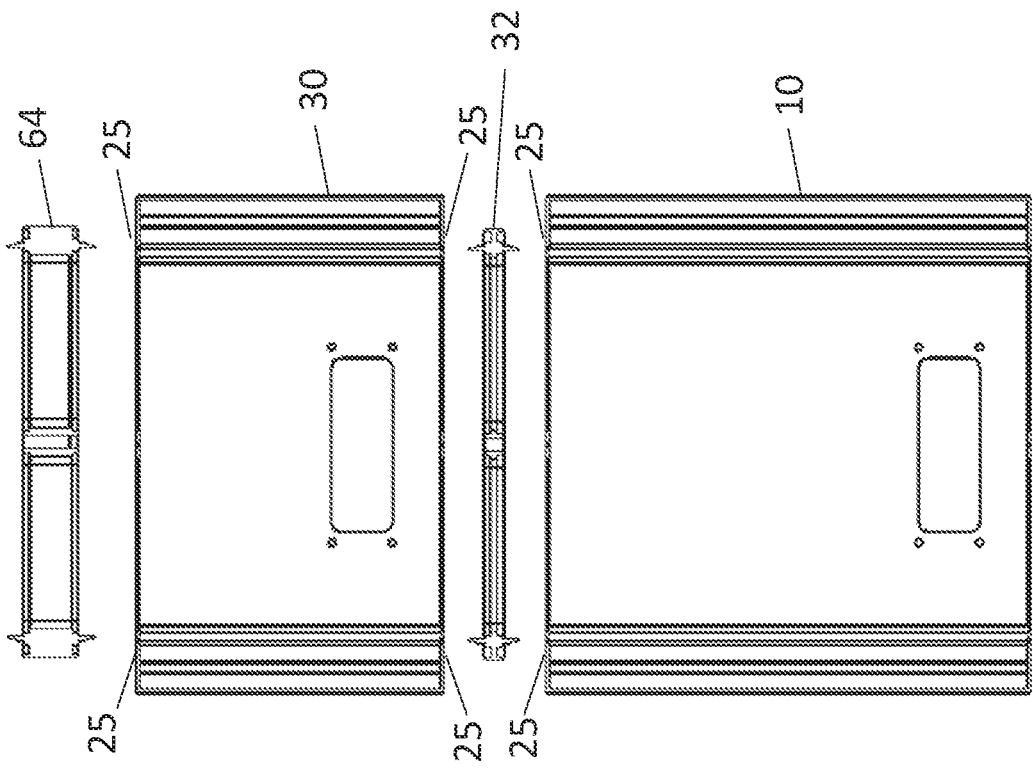

FIG. 8 schematically shows a longitudinal section through the first and second housings 10, 30 and through the two coupling elements 32, 64. In the housings 10, 30 there are arranged slots 25 in which the detent projections 38, 40, 42, 44, 66, 68, 70, 72 can be latched.

Figure 9:
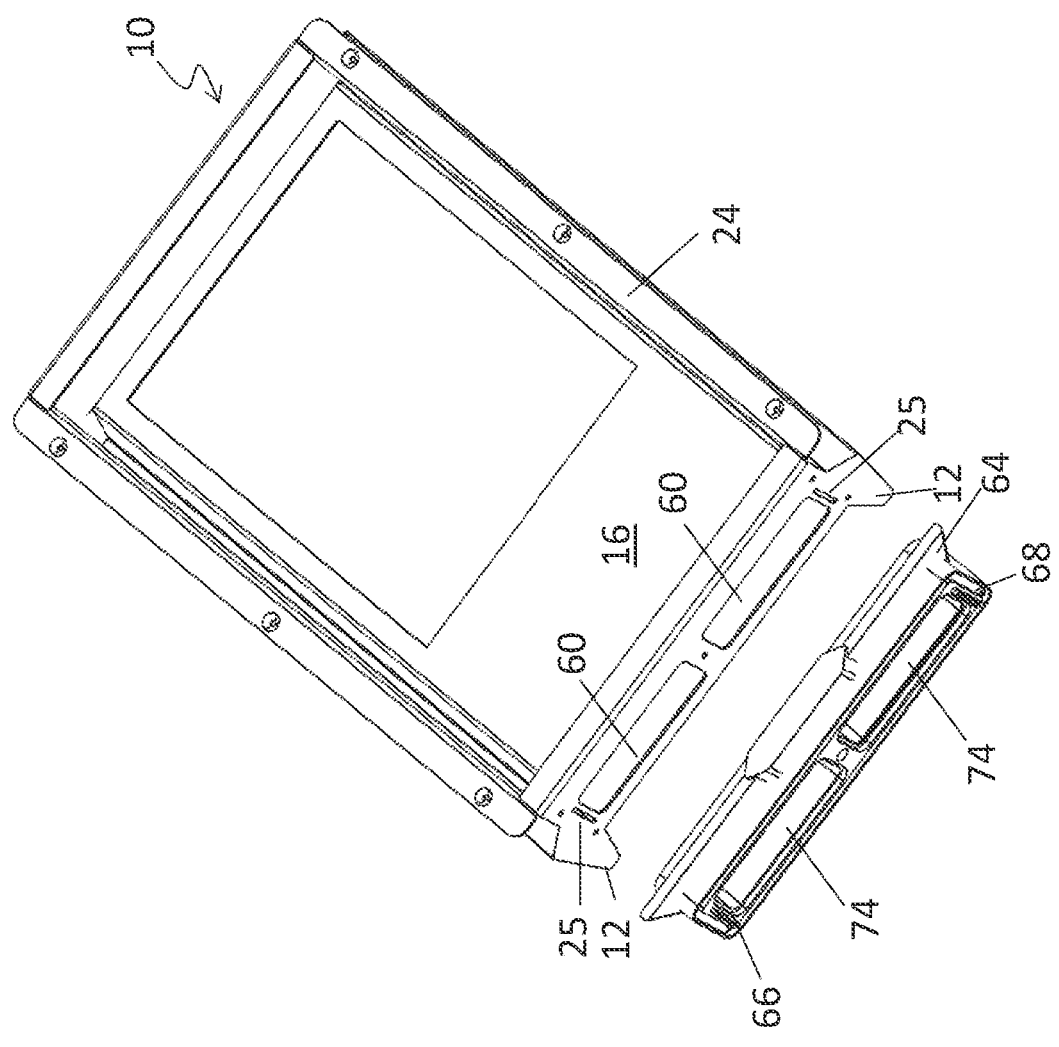

FIG. 9 schematically shows the first housing 10 and the coupling element 64. The coupling element 64 can be arranged on the first housing 10 by inserting the detent projections 70, 72 of the coupling element 64 into the slots 25 on the corresponding frame side and latching them by means of the detent lugs 69, 71. The frame 24 of the first housing 10 has through-recesses 60 which correspond to the through-recesses 74 of the coupling element 64 and through which, for example, electrical lines can be passed.

Figure 10:
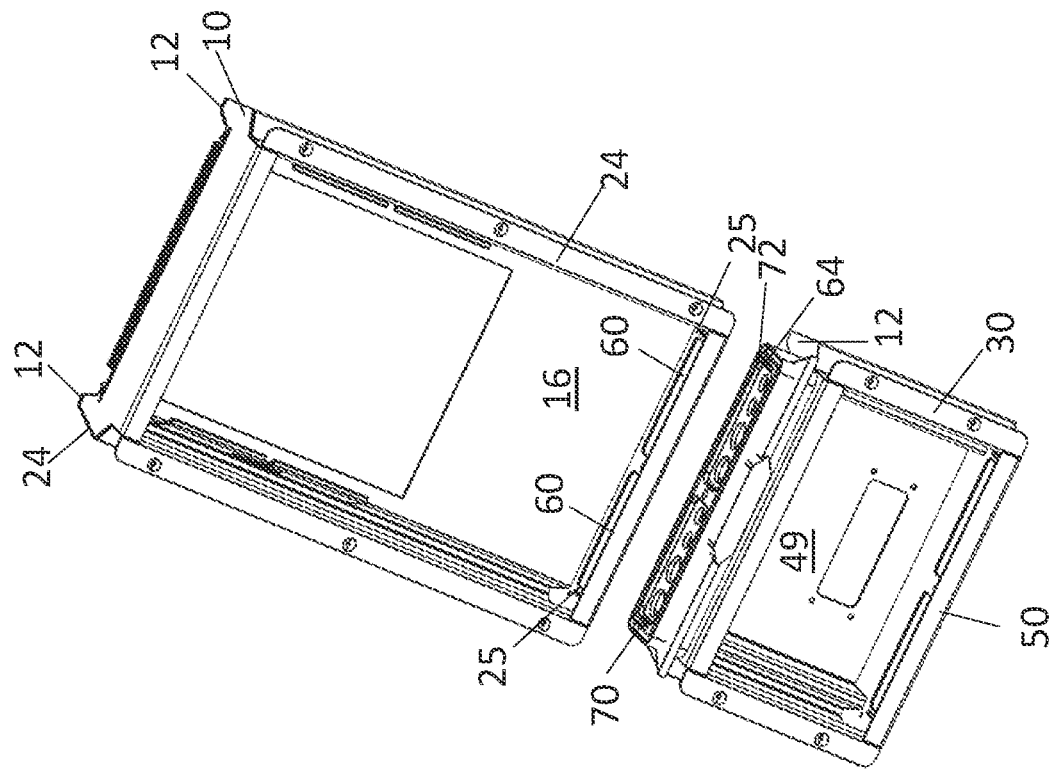

FIG. 10 shows how the coupling element 64 is arranged on the second housing 30. Here, the detent projections 66, 68 are inserted into slots 25 of the second housing and latched in the slots 25 of the second housing 30 by the detent lugs 65, 67. The free detent projections 70, 72 of the coupling element 64 may be inserted into slots of the first housing 10 and latched therein by means of the detent lugs 69, 72. The housings 10, 30 can thus be connected and positioned.

In one embodiment, in the case of a wall bracketing according to FIG. 5, a coupling element 32, 64 can be positioned between the first and second housings 10, 30 and latched to the housings 10, 30 as described. In one embodiment, the second housing 30 can be held here at least temporarily by the first housing 10. Subsequently, the housings 10, 30 connected in this way can optionally be screwed together. Optionally, further housings can be mounted, for example a third housing to the second housing 30 opposite the first housing 10 or to the first housing 10 opposite the second housing 30. Such further housings can be fastened by means of further wall brackets 20, which are spaced apart from the wall brackets 20 of the first or the second housing 10, 30 via further wall rails 62. Optionally, further housings mountable in a horizontal direction are also conceivable. Connecting electrical lines can be routed through the through-recesses 60 in the frame 24 of the first housing 10 and in the frame 50 of the second housing 30, as well as the through-recesses 74 of the coupling element 64.

What is claimed is:

1. A modular electronic power converter, comprising a first housing, a second housing, and a coupling element, wherein the coupling element is arranged between the first and second housings and is connected to at least one of the housings via a detent connection,
   wherein the first and second housings each comprise a rear side and a peripheral frame having a first frame side and a second frame side oriented substantially parallel to each other, wherein the first frame side of one housing is connected to the second frame side of the other housing via the coupling element,
   wherein the first housing or the second housing, or both, each have a peg on opposite third and fourth frame sides oriented substantially perpendicular to the first frame side or the second frame side,
   a wall bracket having a base side attachable to a wall and two edge sides,
   wherein the edge sides of the wall bracket each have a T-shaped recess, wherein the edge sides rest against opposite third and fourth frame sides of the first housing or the second housing in such a way that the pegs engage in one each of the T-shaped recesses, and
   wherein the T-shaped recesses are opposite each other.

2. The modular electronic power converter as claimed in claim 1, wherein the peripheral frame of the first housing or the second housing, or both, has at least one slot on the first frame side or the second frame side, or both.

3. The modular electronic power converter as claimed in claim 2 wherein the wall bracket has a substantially U-shaped profile.

4. The modular electronic power converter as claimed in claim 1, wherein the coupling element is plate-like and comprises a base plate with at least one through-recess.

5. The modular electronic power converter as claimed in claim 4, wherein the base plate comprises at least one first detent projection running transversely to the base plate and having a first detent lug.

6. The modular electronic power converter as claimed in claim 5, wherein the at least one detent projection is latched in a slot of the first housing or the second housing.

7. The modular electronic power converter as claimed in claim 6, wherein the peripheral frame of the first housing and of the second housing each comprise the slot, wherein the slots of the first and second housings are arranged such that opposite detent projections are latched in the slots of the first and second housings to connect the first and second housings by the coupling element, wherein the coupling element is arranged between the peripheral frames of the first and second housings.

8. The modular electronic power converter as claimed in claim 5, wherein the base plate of the coupling element comprises, on its side opposite the at least one first detent projection, a second detent projection running transversely to the base plate and having a second detent lug.

9. The modular electronic power converter as claimed in claim 4, wherein the base plate is made of solid plastic.

10. The modular electronic power converter as claimed in claim 4, wherein the at least one through-recess has a peripheral protrusion.

11. The modular electronic power converter as claimed in claim 10, wherein the coupling element has an elastic insert that has a peripheral groove, wherein an insert is arranged in the through-recess in such a way that the peripheral protrusion engages in the peripheral groove so that the insert seals the through-recess.

12. The modular electronic power converter as claimed in claim 11, wherein the elastic insert has at least one recess, which is formed as a blind recess or through-recess, wherein the through-recess is configured to serve as a feedthrough for current-carrying lines of the power converter.

13. The modular electronic power converter as claimed in claim 1, wherein the T-shaped recesses of the wall bracket are aligned such that roofs of the T-shaped recesses run substantially parallel to the base side and parallel to the third and fourth frame sides.

14. The modular electronic power converter as claimed in claim 1, wherein the pegs have a circular cross-section.

15. The modular electronic power converter as claimed in claim 1, wherein the first housing or the second housing, or both, comprise two elongate rear projections running parallel to each other in their longitudinal direction and parallel to the third and fourth frame sides, wherein the pegs are arranged on sides of the elongate rear projections facing each other.

16. The modular electronic power converter as claimed in claim 15, wherein the edge sides of the wall bracket are formed as a V-profile with a first leg and a second leg, wherein the first leg of each edge side adjoins the base side and the second leg of each edge side adjoins the first leg, wherein vertices of the V-profile are each directed outwards and the rear projections lie flat on outer sides of the respective second legs of the wall bracket.

17. The modular electronic power converter as claimed in claim 16, wherein the T-shaped recesses are centered in the respective second legs of the edge side.

18. The modular electronic power converter as claimed in claim 1, wherein foot points of the T-shaped recesses are closed.

19. The modular electronic power converter as claimed in claim 1, wherein at least one of the first and second housings is fixed to the wall bracket using a screw.

20. The modular electronic power converter as claimed in claim 1, wherein the first housing is connected to a first wall bracket and the second housing is connected to a second wall bracket, wherein, in an assembled state of the power converter, the pegs of the first housing are arranged at respective lower end points of the roof of the T-shaped recesses of the first wall bracket and the pegs of the second housing are arranged at respective upper end points of the roof of the T-shaped recesses of the second wall bracket.

21. The modular electronic power converter as claimed in claim 1, wherein the coupling element comprises a display unit configured to display operational data of the power converter.

* * * * *